(12) United States Patent
Blonigan et al.

(10) Patent No.: US 7,270,713 B2
(45) Date of Patent: *Sep. 18, 2007

(54) TUNABLE GAS DISTRIBUTION PLATE ASSEMBLY

(75) Inventors: Wendell T. Blonigan, Union City, CA (US); John M. White, Hayward, CA (US); William A. Bagley, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 16 days.

This patent is subject to a terminal disclaimer.

(21) Appl. No.: 10/337,483

(22) Filed: Jan. 7, 2003

(65) Prior Publication Data
US 2004/0129211 A1 Jul. 8, 2004

(51) Int. Cl.
| C23C 16/455 | (2006.01) |
| C23C 16/50 | (2006.01) |
| C23C 16/503 | (2006.01) |
| C23C 16/505 | (2006.01) |
| C23C 16/509 | (2006.01) |
| C23F 1/00 | (2006.01) |
| H01L 21/306 | (2006.01) |

(52) U.S. Cl. ............ 118/715; 118/723 E; 156/345.33; 156/345.34; 156/345.43; 156/345.44

(58) Field of Classification Search ............ 118/715, 118/728, 50; 156/345.29, 345.33–36, 345.26, 156/345.51
See application file for complete search history.

(56) References Cited

U.S. PATENT DOCUMENTS

| 4,262,631 A | 4/1981 | Kubacki | 118/723 MP |
| 4,532,150 A | 7/1985 | Endo et al. | 427/577 |
| 4,634,601 A | 1/1987 | Hamakawa et al. | 208/348 |
| 4,759,947 A | 7/1988 | Ishihara et al. | 438/485 |
| 4,792,378 A | 12/1988 | Rose et al. | 156/643 |
| 4,892,753 A | 1/1990 | Wang et al. | 427/38 |
| 5,000,113 A | 3/1991 | Wang et al. | 118/723 |
| 5,074,456 A * | 12/1991 | Degner et al. | 228/121 |

(Continued)

FOREIGN PATENT DOCUMENTS

| EP | 0 613 178 A2 | 8/1994 |
| EP | 1 118 693 A2 | 7/2001 |
| WO | WO01/75188 | 10/2001 |

OTHER PUBLICATIONS

PCT Invitation To Pay Additional Fees dated Aug. 19, 2004.
PCT Search Report dated Dec. 27, 2004 for International Application No. PCT/US2004/011477.
U.S. Appl. No. 09/602,657, filed Jun. 22, 2000, Vo et al.
Rader, et al., "Showerhead-enhanced inertial particle deposition in parallel-plate reactors," Aerosol Science and Technology, 1998, V28, N2 (Feb), p. 105-132.

*Primary Examiner*—Rudy Zervigon
(74) *Attorney, Agent, or Firm*—Patterson & Sheridan LLP (57) ABSTRACT

A gas distribution plate assembly and a method for distributing gas in a processing chamber are provided. In one embodiment, a gas distribution plate assembly includes a tuning plate coupled to a diffuser plate. The tuning plate has a plurality of orifice holes formed therethrough that align with a plurality of apertures formed through the diffuser plate, where the apertures each have a greater sectional area than the holes in the tuning plate. Each aperture is aligned with a respective hole to define gas passages through the gas distribution plate assembly. The tuning plate may be interchanged with a replacement tuning plate to change the gas flow characteristics through the gas distribution plate assembly.

30 Claims, 11 Drawing Sheets

U.S. PATENT DOCUMENTS

| | | | | |
|---|---|---|---|---|
| 5,089,083 | A | * | 2/1992 | Kojima et al. ............... 438/729 |
| 5,238,866 | A | | 8/1993 | Bolz et al. .................. 427/568 |
| 5,304,248 | A | | 4/1994 | Cheng et al. ................ 427/595 |
| 5,362,526 | A | | 11/1994 | Wang et al. ................. 427/573 |
| 5,423,936 | A | * | 6/1995 | Tomita et al. .......... 156/345.34 |
| 5,465,680 | A | | 11/1995 | Loboda ...................... 118/728 |
| 5,589,002 | A | * | 12/1996 | Su ........................ 118/723 E |
| 5,595,606 | A | * | 1/1997 | Fujikawa et al. ............ 118/725 |
| 5,624,498 | A | | 4/1997 | Lee et al. ..................... 117/84 |
| 5,643,394 | A | | 7/1997 | Maydan et al. ............. 156/345 |
| 5,711,987 | A | | 1/1998 | Bearinger et al. .......... 118/715 |
| 5,730,792 | A | | 3/1998 | Camilletti et al. .............. 427/7 |
| 5,746,875 | A | | 5/1998 | Mayden et al. ............. 156/345 |
| 5,755,886 | A | | 5/1998 | Wang et al. ................. 118/715 |
| 5,776,235 | A | | 7/1998 | Camilletti et al. ..... 106/287.14 |
| 5,780,163 | A | | 7/1998 | Camilletti et al. ......... 427/86.2 |
| 5,818,071 | A | | 10/1998 | Loboda et al. .............. 428/446 |
| 5,882,411 | A | | 3/1999 | Zhao et al. ................... 257/77 |
| 5,964,947 | A | | 10/1999 | Zhao et al. ................. 118/715 |
| 6,007,633 | A | | 12/1999 | Kitamura et al. ........... 118/724 |
| 6,024,799 | A | * | 2/2000 | Chen et al. ................. 118/715 |
| RE36,623 | E | | 3/2000 | Wang et al. ................. 427/579 |
| 6,054,379 | A | | 4/2000 | Yau et al. ................... 118/715 |
| 6,072,227 | A | | 6/2000 | Yau et al. ................... 438/623 |
| 6,080,446 | A | | 6/2000 | Tobe et al. ................. 257/642 |
| 6,110,287 | A | | 8/2000 | Arai et al. ............. 156/345.34 |
| 6,126,753 | A | | 10/2000 | Shinriki et al. ............. 118/715 |
| 6,132,512 | A | | 10/2000 | Horie et al. ................ 118/715 |
| 6,140,226 | A | | 10/2000 | Grill et al. .................. 438/637 |
| 6,147,009 | A | | 11/2000 | Grill et al. .................. 438/780 |
| 6,159,871 | A | | 12/2000 | Loboda et al. .............. 438/786 |
| 6,167,834 | B1 | | 1/2001 | Wang et al. ............. 118/723 E |
| 6,167,837 | B1 | * | 1/2001 | Cook ..................... 118/723 E |
| 6,206,972 | B1 | | 3/2001 | Dunham ..................... 118/715 |
| 6,230,651 | B1 | | 5/2001 | Ni et al. .................. 118/723 I |
| 6,263,829 | B1 | | 7/2001 | Schneider et al. ......... 118/723 I |
| 6,284,673 | B2 | | 9/2001 | Dunham ...................... 38/758 |
| 6,287,990 | B1 | | 9/2001 | Cheung et al. ............. 438/780 |
| 6,303,523 | B2 | | 10/2001 | Cheung et al. ............. 438/780 |
| 6,340,435 | B1 | | 1/2002 | Bjorkman et al. ............. 216/72 |
| 6,348,725 | B2 | | 2/2002 | Cheung et al. ............. 257/642 |
| 6,364,954 | B2 | | 4/2002 | Umotoy et al. ............. 118/715 |
| 6,368,450 | B2 | | 4/2002 | Hayashi ...................... 156/345 |
| 6,413,583 | B1 | | 7/2002 | Moghadam et al. ... 427/249.15 |
| 6,454,860 | B2 | | 9/2002 | Metzner et al. ............. 118/715 |
| 6,461,435 | B1 | | 10/2002 | Littau et al. ................ 118/715 |
| 6,511,903 | B1 | | 1/2003 | Yau et al. ................... 438/623 |
| 6,511,909 | B1 | | 1/2003 | Yau et al. ................... 438/638 |
| 6,537,929 | B1 | | 3/2003 | Cheung et al. ............. 438/790 |
| 6,541,282 | B1 | | 4/2003 | Cheung et al. ................. 438/5 |
| 6,562,690 | B1 | | 5/2003 | Cheung et al. ............. 438/400 |
| 6,565,661 | B1 | | 5/2003 | Nguyen ...................... 118/715 |
| 6,593,247 | B1 | | 7/2003 | Huang et al. ............... 438/758 |
| 6,596,655 | B1 | | 7/2003 | Cheung et al. ............. 438/789 |
| 6,627,532 | B1 | | 9/2003 | Gaillard et al. ............. 438/623 |
| 6,638,392 | B2 | | 10/2003 | Yamamoto et al. .... 156/345.41 |
| 6,641,673 | B2 | | 11/2003 | Yang ......................... 118/703 |
| 6,660,656 | B2 | | 12/2003 | Cheung et al. ................ 438/76 |
| 6,660,663 | B1 | | 12/2003 | Cheung et al. ............. 438/789 |
| 6,793,733 | B2 | | 9/2004 | Janakiraman et al. ....... 118/715 |
| 6,827,815 | B2 | * | 12/2004 | Hytros et al. .......... 156/345.33 |
| 6,838,012 | B2 | * | 1/2005 | Lenz ........................... 216/71 |
| 2002/0000670 | A1 | | 1/2002 | Yau et al. ................... 257/759 |
| 2002/0017243 | A1 | | 2/2002 | Pyo ........................... 118/715 |
| 2002/0069968 | A1 | * | 6/2002 | Keller et al. ............ 156/345.33 |
| 2002/0129769 | A1 | | 9/2002 | Kim et al. ............... 118/723 E |
| 2003/0207033 | A1 | | 11/2003 | Yim et al. ............. 427/255.37 |
| 2004/0173313 | A1 | | 9/2004 | Beach .................. 156/345.33 |
| 2004/0206305 | A1 | | 10/2004 | Choi et al. .................. 118/715 |

* cited by examiner

TUNABLE GAS DISTRIBUTION PLATE ASSEMBLY

BACKGROUND OF THE DISCLOSURE

1. Field of the Invention

Embodiments of the invention generally relate to a gas distribution plate assembly and method for distributing gas in a processing chamber.

2. Description of the Background Art

Liquid crystal displays or flat panels are commonly used for active matrix displays such as computer and television monitors. Generally, flat panels comprise two glass plates having a layer of liquid crystal material sandwiched therebetween. At least one of the glass plates includes at least one conductive film disposed thereon that is coupled to a power supply. Power supplied to the conductive film from the power supply changes the orientation of the crystal material, creating a pattern such as text or graphics seen on the display. One fabrication process frequently used to produce flat panels is plasma enhanced chemical vapor deposition (PECVD).

Plasma enhanced chemical vapor deposition is generally employed to deposit thin films on a substrate such as a flat panel or semiconductor wafer. Plasma enhanced chemical vapor deposition is generally accomplished by introducing a precursor gas into a vacuum chamber that contains a flat panel. The precursor gas is typically directed through a distribution plate situated near the top of the chamber. The precursor gas in the chamber is energized (e.g., excited) into a plasma by applying RF power to the chamber from one or more RF sources coupled to the chamber. The excited gas reacts to form a layer of material on a surface of the flat panel that is positioned on a temperature controlled substrate support. In applications where the flat panel receives a layer of low temperature polysilicon, the substrate support may be heated in excess of 400 degrees Celsius. Volatile by-products produced during the reaction are pumped from the chamber through an exhaust system.

Flat panels processed by PECVD techniques are typically large, often exceeding 360 mm×460 mm and ranging over 1 square meter in size. Gas distribution plates utilized to provide uniform process gases flow over flat panels are proportionally large in size, particularly as compared to gas distribution plates utilized for 200 mm and 300 mm semiconductor wafer processing.

Large gas distribution plates utilized for flat panel processing have a number of fabricating issues that result in high costs for manufacturing the gas distribution plate. For example, gas flow holes formed through the gas distribution plate are small in diameter relative to thickness of the gas distribution plate, resulting in a high frequency of drill bit breakage during hole formation. Removal of broken drill bits is time consuming and may result in the entire gas distribution plate being scrapped. Additionally, as the number of gas flow holes formed through the gas distribution plate is proportional in size to the flat panel, the great number of holes formed in each plate disadvantageously contributes to a high probability of trouble during plate fabrication. Moreover, the high number of holes coupled with the care required to minimize drill bit breakage results in long fabrication times, thereby elevating fabrication costs.

As the cost of materials and manufacturing the gas distribution plate is great, it would be advantageous to develop a gas distribution plate in a configuration that can be efficiently and cost effectively fabricated. Moreover, as the size of the next generation gas distribution plates are increased to accommodate processing flat panels in excess of 1.44 square meters, the aforementioned problems become increasingly important to resolve.

Therefore, there is a need for an improved gas distribution plate.

SUMMARY OF THE INVENTION

A gas distribution plate assembly and a method for distributing gas in a processing chamber are provided. In one embodiment, a gas distribution plate assembly includes a tuning plate coupled to a diffuser plate. The tuning plate has a plurality of orifice holes formed therethrough that align with a plurality of apertures formed through the diffuser plate, where the apertures each have a greater sectional area than the holes in the tuning plate. Each aperture is aligned with a respective hole to define gas passages through the gas distribution plate assembly. The tuning plate may be interchanged with a replacement tuning plate to change the gas flow characteristics through the gas distribution plate assembly.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

The invention generally provides a gas distribution plate assembly and methods for tuning gas delivery within a processing chamber. The invention is illustratively described below in reference to a plasma enhanced chemical vapor deposition system configured to process large area substrates, such as a plasma enhanced chemical vapor deposition (PECVD) system, available from AKT, a division of Applied Materials, Inc., Santa Clara, Calif. However, it should be understood that the invention has utility in other system configurations such as etch systems, other chemical vapor deposition systems and any other system in which distributing gas within a process chamber is desired, including those systems configured to process round substrates.

Figure 1:
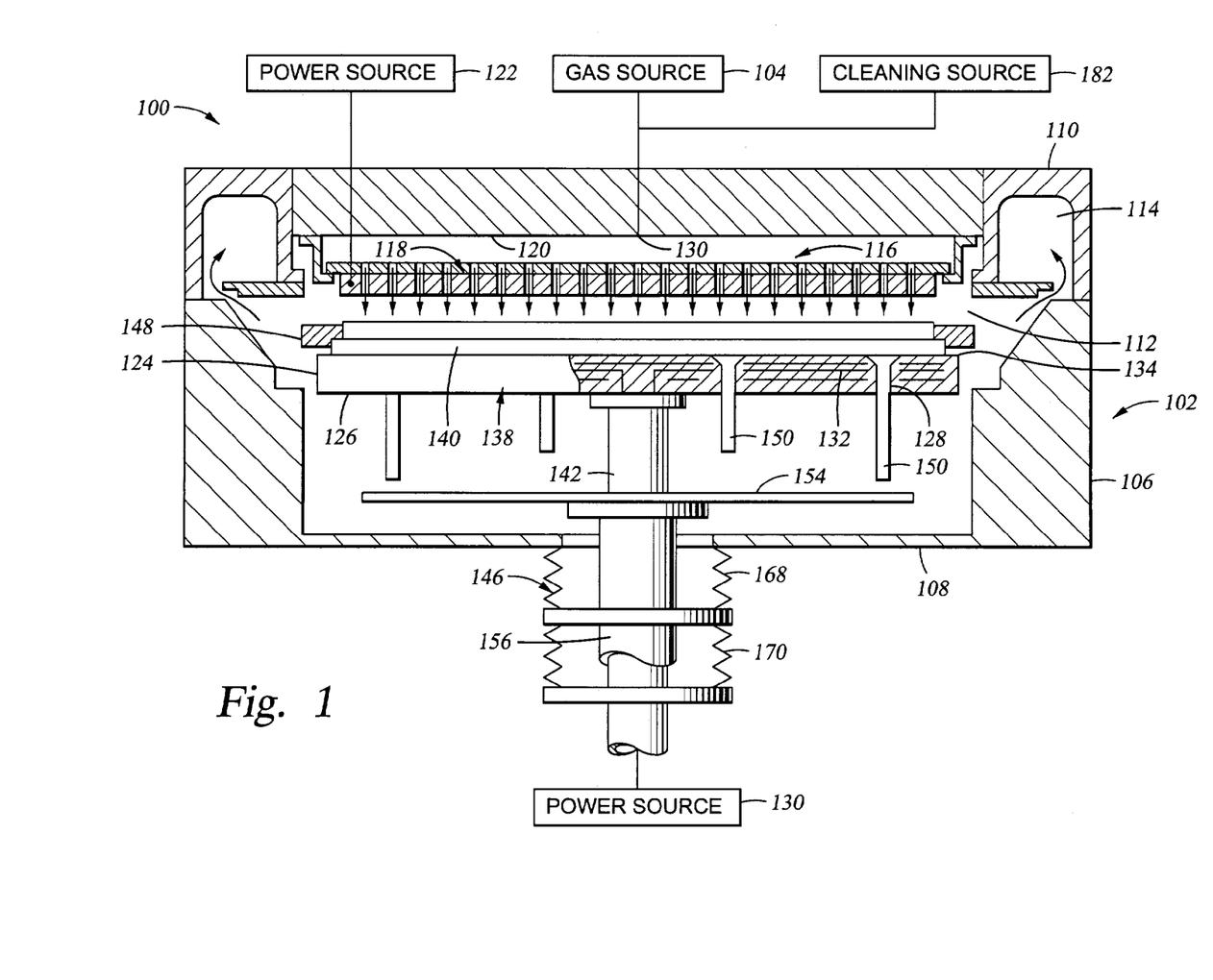
FIG. 1 is a schematic sectional view of one embodiment of a processing chamber having a gas distribution plate assembly of the present invention.

FIG. 1 is a cross sectional view of one embodiment of a plasma enhanced chemical vapor deposition system 100. The system 100 generally includes a processing chamber 102 coupled to a gas source 104. The processing chamber 102 has walls 106 and a bottom 108 that partially define a process volume 112. The process volume 112 is typically accessed through a port (not shown) in the walls 106 that facilitates movement of a substrate 140 into and out of the processing chamber 102. The walls 106 and bottom 108 are typically fabricated from a unitary block of aluminum or other material compatible for processing. The walls 106 support a lid assembly 110 that contains a pumping plenum 114 that couples the process volume 112 to an exhaust port (that includes various pumping components, not shown).

A temperature controlled substrate support assembly 138 is centrally disposed within the processing chamber 102. The support assembly 138 supports the substrate 140 during processing. In one embodiment, the substrate support assembly 138 comprises an aluminum body 124 that encapsulates at least one embedded heater 132.

The heater 132, such as a resistive element, disposed in the support assembly 138, is coupled to a power source 130 and controllably heats the support assembly 138 and the substrate 140 positioned thereon to a predetermined temperature. Typically, in a CVD process, the heater 132 maintains the substrate 140 at a uniform temperature between about 150 to at least about 460 degrees Celsius, depending on the deposition processing parameters for a material being depositing on the substrate 140.

Generally, the support assembly 138 has a lower side 126 and an upper side 134. The upper side 134 supports the substrate 140. The lower side 126 has a stem 142 coupled thereto. The stem 142 couples the support assembly 138 to a lift system (not shown) that moves the support assembly 138 between an elevated processing position (as shown) and a lowered position that facilitates substrate transfer to and from the processing chamber 102. The stem 142 additionally provides a conduit for electrical and thermocouple leads between the support assembly 138 and other components of the system 100.

A bellows 146 is coupled between support assembly 138 (or the stem 142) and the bottom 108 of the processing chamber 102. The bellows 146 provides a vacuum seal between the process volume 112 and the atmosphere outside the processing chamber 102 while facilitating vertical movement of the support assembly 138.

The support assembly 138 generally is grounded such that RF power supplied by a power source 122 to a gas distribution plate assembly 118 positioned between the lid assembly 110 and substrate support assembly 138 (or other electrode positioned within or near the lid assembly of the chamber) may excite gases present in the process volume 112 between the support assembly 138 and the distribution plate assembly 118. The RF power from the power source 122 is generally selected commensurate with the size of the substrate to drive the chemical vapor deposition process.

The support assembly 138 additionally supports a circumscribing shadow frame 148. Generally, the shadow frame 148 prevents deposition at the edge of the substrate 140 and support assembly 138 so that the substrate does not stick to the support assembly 138.

The support assembly 138 has a plurality of holes 128 disposed therethrough that accept a plurality of lift pins 150.

The lift pins 150 are typically comprised of ceramic or anodized aluminum. Generally, the lift pins 150 have first ends that are substantially flush with or slightly recessed from an upper side 134 of the support assembly 138 when the lift pins 150 are in a normal position (i.e., retracted relative to the support assembly 138). The first ends are typically flared to prevent the lift pins 150 from falling through the holes 128. Additionally, the lift pins 150 have a second end that extends beyond the lower side 126 of the support assembly 138. The lift pins 150 may be actuated relative to the support assembly 138 by a lift plate 154 to project from the upper side 134 of the support assembly 138 thereby placing the substrate in a spaced-apart relation to the support assembly 138.

The lift plate 154 is disposed between the lower side 126 of the substrate support assembly 138 and the bottom 108 of the processing chamber 102. The lift plate 154 is connected to an actuator (not shown) by a collar 156 that circumscribes a portion of the stem 142. The bellows 146 includes an upper portion 168 and a lower portion 170 that allows the stem 142 and collar 156 to move independently while maintaining the isolation of the process volume 112 from the environment exterior to the processing chamber 102. Generally, the lift plate 154 is actuated to cause the lift pins 150 to extend from the upper side 134 as the support assembly 138 and the lift plate 154 move closer together relative to one another.

The lid assembly 110 provides an upper boundary to the process volume 112. The lid assembly 110 typically can be removed or opened to service the processing chamber 102. In one embodiment, the lid assembly 110 is fabricated from aluminum.

The lid assembly 110 includes a pumping plenum 114 formed therein coupled to an external pumping system (not shown). The pumping plenum 114 is utilized to channel gases and processing by-products uniformly from the process volume 112 and out of the processing chamber 102.

The lid assembly 110 typically includes an entry port 180 through which process gases provided by the gas source 104 are introduced into the processing chamber 102. The entry port 180 is also coupled to a cleaning source 182. The cleaning source 182 typically provides a cleaning agent, such as disassociated fluorine, that is introduced into the processing chamber 102 to remove deposition byproducts and films from processing chamber hardware, including the gas distribution plate assembly 118.

The gas distribution plate assembly 118 is coupled to an interior side 120 of the lid assembly 110. The gas distribution plate assembly 118 is typically configured to substantially follow the profile of the substrate 140, for example, polygonal for large area substrates and circular for wafers. The gas distribution plate assembly 118 includes a perforated area 116 through which process and other gases supplied from the gas source 104 are delivered to the process volume 112. The perforated area 116 of the gas distribution plate assembly 118 is configured to provide uniform distribution of gases passing through the gas distribution plate assembly 118 into the processing chamber 102. One gas distribution plate that may be adapted to benefit from the invention is described in U.S. patent application Ser. No. 09/922,219, filed Aug. 8, 2001 by Keller et al., and is hereby incorporated by reference in its entirety.

Figure 2A:
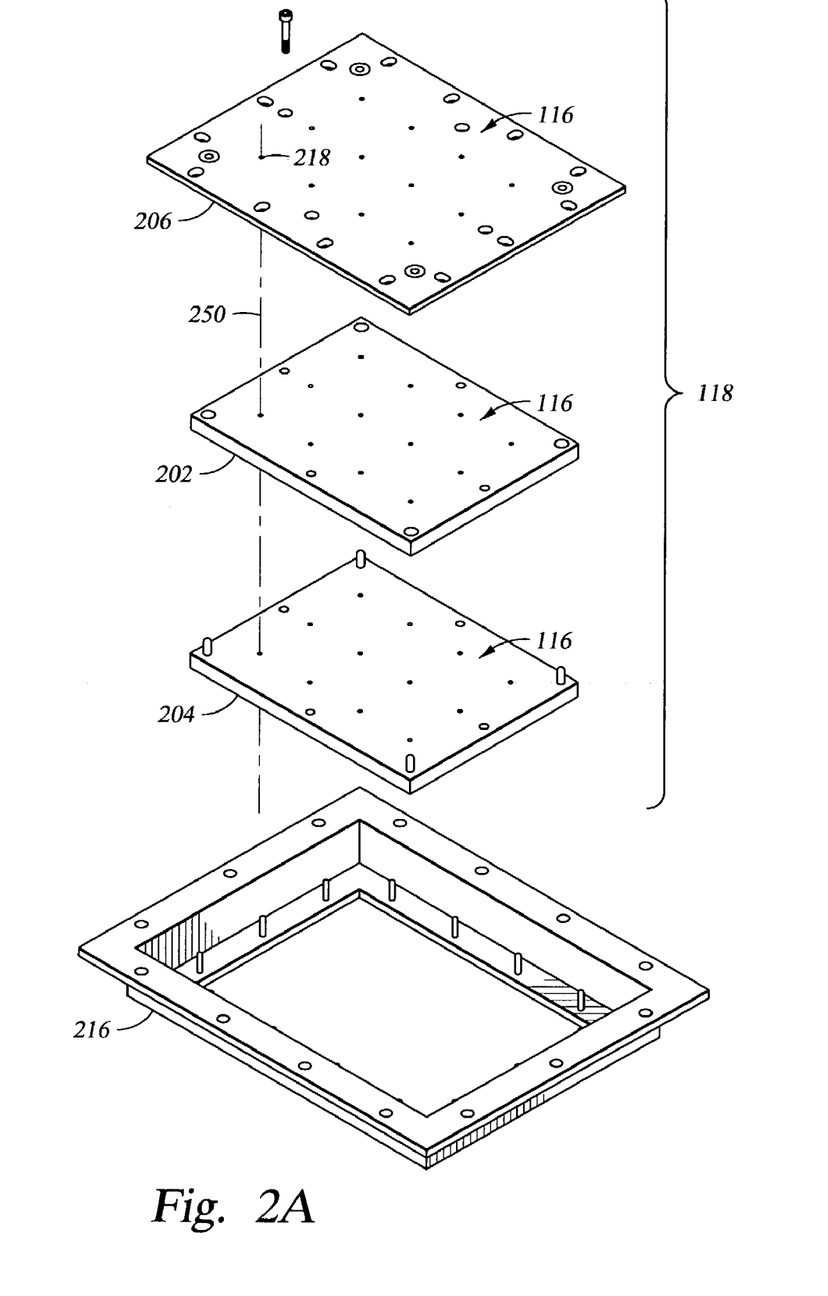
FIG. 2A is an exploded perspective view of the gas distribution plate assembly depicted in FIG. 1.

FIG. 2A depicts an exploded view of one embodiment of the gas distribution plate assembly 118. The gas distribution plate assembly 118 can include a diffuser plate 204 or "first" plate and a backing plate 206 coupled together and sandwiching a tuning plate 202 or "second" plate therebetween.

Figure 2B:
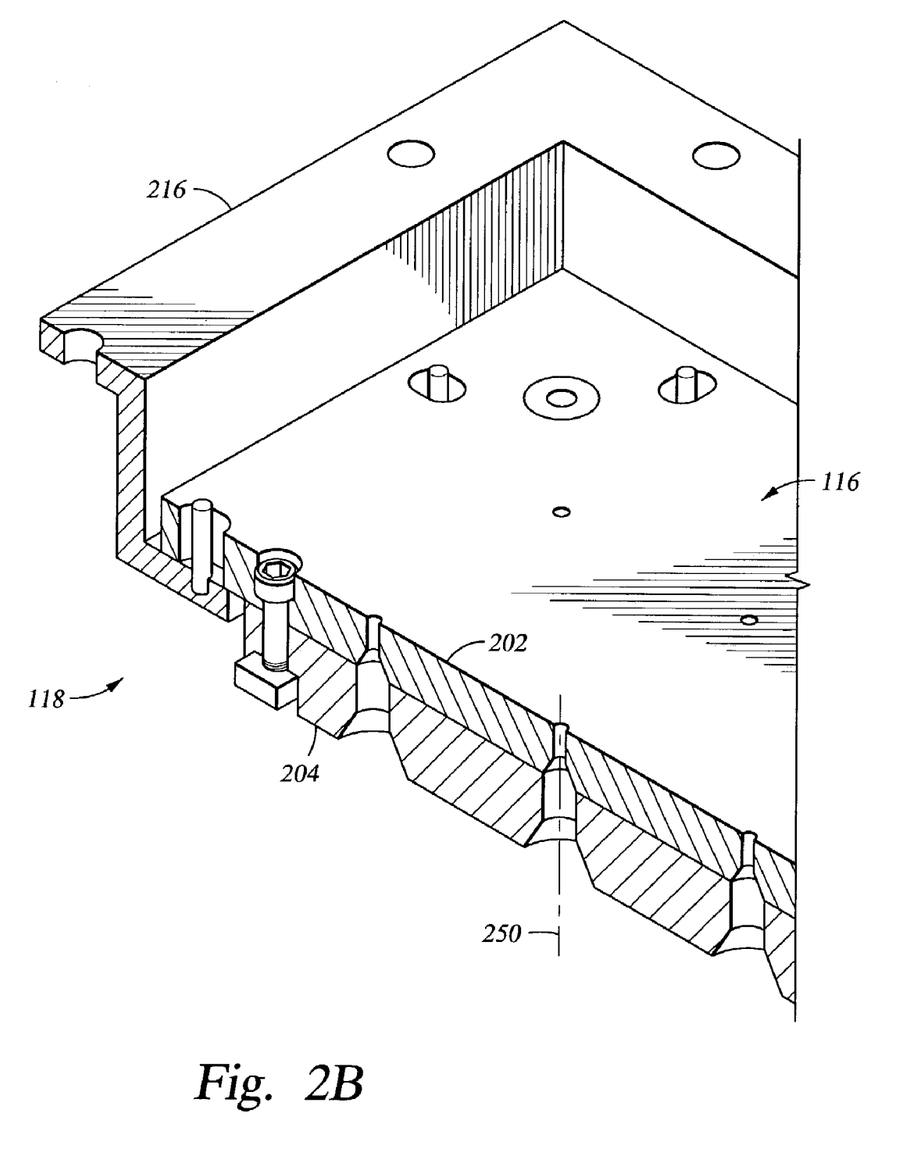
FIG. 2B is a partial perspective sectional view of another embodiment of a gas distribution plate assembly.

The tuning plate 202 and backing plate 206 may alternatively comprise a single unitary member (as shown in FIG. 2B).

A plurality of gas passages 250 (shown by a dotted line through the separated plates 202, 204) are formed through the tuning plate 202 and the diffuser plate 204 to allow a predetermined distribution of gas passing through the gas distribution plate assembly 118 and into the process volume 112.

The backing plate 206 is typically fabricated from stainless steel, aluminum, or nickel or other RF conductive material. The backing plate 206 includes a plurality of apertures 218 that align with the gas passages 250 to facilitate unobstructed gas flow through the backing plate 206 to the gas passages 250. Alternatively, the backing plate 206 may be configured as a frame to expose the perforated area 116 extending through the tuning plate 202 and diffuser plate 204. The backing plate 206 generally provides a mounting surface for coupling the tuning plate 202 to the lid assembly 110 or chamber walls 106. In the embodiment depicted in FIGS. 2A and 2B, the backing plate 206 is coupled to the lid assembly 110 by an expansion bracket 216.

Figure 3:
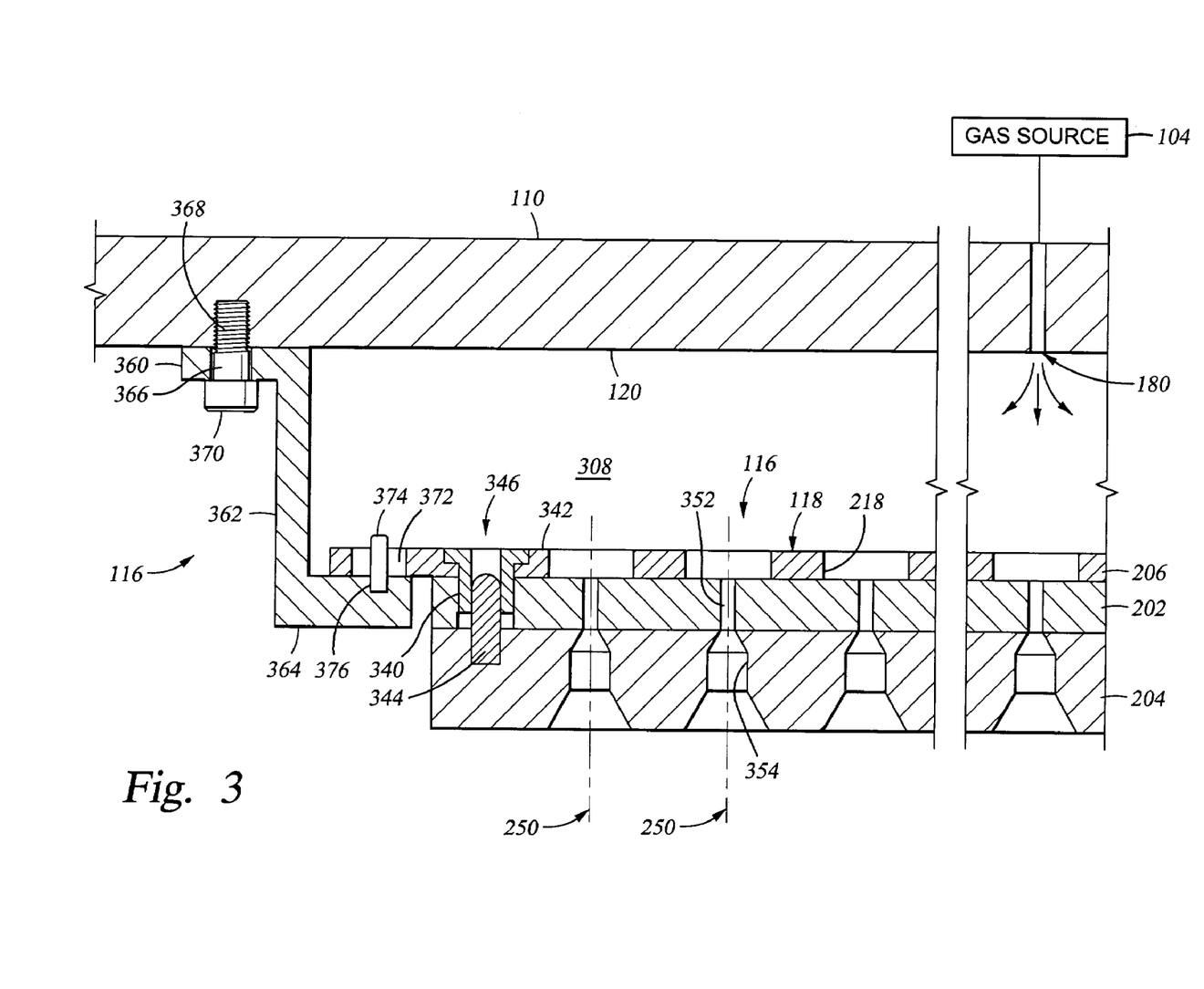
FIG. 3 is a sectional view of the gas distribution plate assembly depicted in FIG. 2A.

FIG. 3 is a sectional view of the gas distribution plate assembly 118 and expansion bracket 216 of FIG. 2A. The expansion bracket 216 is typically fabricated from stainless steel, aluminum, nickel or other RF conductive material. The expansion bracket 216 maintains the tuning plate 202 and the interior side 120 of the lid assembly 110 in a spaced-apart relation, defining a plenum 308 therebetween. The plenum 308 allows gases flowing through the lid assembly 110 to uniformly distribute across the width of the tuning plate 202 so that gas is provided uniformly above the center perforated area 116.

The expansion bracket 216 and the tuning plate 202 are coupled in a manner that facilitates thermal expansion and contraction of the tuning plate 202 (and diffuser plate 204) without warpage, distortion or adversely stressing the plates 202, 204 in a manner that would affect the uniformity of gas flow through the gas distribution plate assembly 118.

In one embodiment, the expansion bracket 216 is a polygonal frame that includes a first flange 360 that extends outward from a main body 362 and a second flange 364 that extends inward in the opposite direction of the first flange 360. Alternatively, the expansion bracket 216 may be a flanged cylinder. The first flange 360 includes a plurality of mounting holes 366, each of which aligning with a threaded hole 368 formed in the lid assembly 110. Vented fasteners 370 are respectively passed through the mounting hole 366 and threaded into the threaded hole 368 to secure the expansion bracket 216 to the lid assembly 110.

Figure 4:
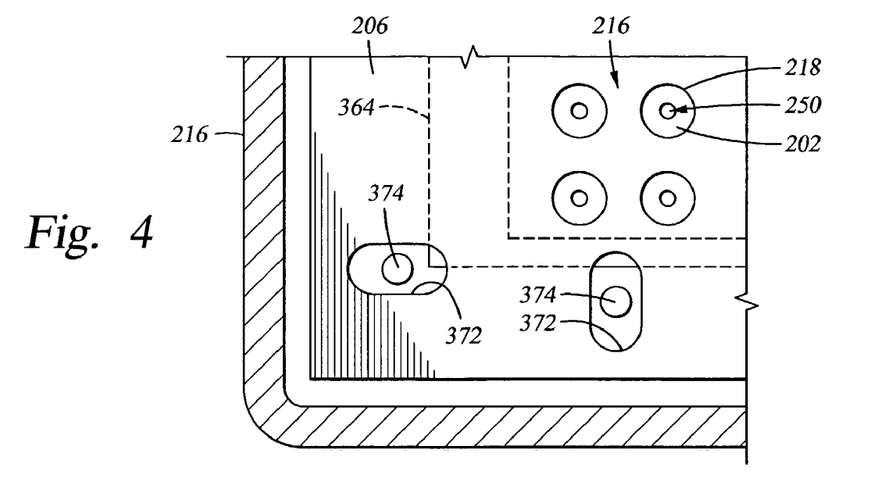
FIG. 4 is a partial top view of the gas distribution plate assembly of FIG. 2A.

The second flange 364 includes a plurality of holes 376 formed therein that respectively retain a dowel pin 374. The dowel pins 374 (one is shown in FIG. 3) extend upward from the second flange 364 toward the first flange 362 and the interior surface 120 of the lid assembly 110. Slots 372 formed through the backing plate 206 (or tuning plate 202) are adapted to respectively accept a pin 374. As depicted in the partial sectional top view of the expansion bracket 216 shown in FIG. 4, the slots 372 in the backing plate 206 are large enough with respect to the dowel pins 374 to allow the distribution plate assembly 118 to move relative to the dowel pins 374 to compensate for differences in thermal expansion between the lid assembly 110/expansion bracket 216 and the distribution plate assembly 118. As depicted in FIG. 4, the slots 372 are typically oriented along each side in orthogonal directions to accommodate expansion of the plate assembly 118 in two axis. Alternatively, the slots 372 may be configured radially for circular gas distribution plates. Thus, as the distribution plate assembly 118 heats and cools, the distribution plate assembly 118 is free to move relative to the lid assembly 110 and thereby remains free from warpage or other stresses that may cause the distribution plate assembly 118 to distort or otherwise alter the pattern of gases flowing through the distribution plate assembly 118.

Returning to FIG. 3, the tuning plate 202 is typically fabricated from stainless steel, aluminum, nickel or other RF conductive material. The tuning plate 202 is typically about $\frac{1}{10}$ the thickness of the diffuser plate 204. The tuning plate 202 includes a plurality of orifice holes 352, each respectively comprising a first portion of one of the gas passages 250. Orifice holes 352 of the gas passage 250 formed through the tuning plate 202 typically has a lower resistance to flow as compared to an aperture 354 formed through the diffuser plate 204 that comprises a second portion of the gas passage 250. The orifice holes 352 typically are configured to provide a flow restriction to gases passing through the gas distribution assembly 118, thereby distributing gases in a predetermined pattern across the width of the assembly 118. The flow resistance through the orifice holes 352 may be configured to have a predetermined pressure drop by selecting a combination of hole diameter and thickness of the tuning plate 202. The flow resistance of the orifice holes 352 may also be set by utilizing surface textures within the hole, chamfering or radiusing the hole edges, or by other methods.

Typically, the orifice holes 352 have a diameter between about 0.2 mm to about 10.0 mm. The orifice holes 352 may have a uniform sectional area across the width of the perforated area 116, or some of the orifice holes 352 may be configured different than others as described with reference to FIGS. 7A-B discussed further below. In the embodiment depicted in FIG. 3, the gas passages 250 are uniformly configured with the same sectional area. As the tuning plate 202 is comparatively thin as compared to conventional gas distribution plates, the orifice holes are easily fabricated, deburred and cleaned, advantageously allowing the tuning plate 202 to be manufactured efficiently and cost effectively, while minimizing possible particular contamination from particles, chips or other contamination often trapped in the long, narrow holes formed in conventional gas distribution plates.

In one embodiment, the tuning plate 202 and backing plate 206 are fabricated from un-anodized aluminum. Fluorine from the cleaning agents has been found to contaminate the anodization layer, which may be released during deposition and captured in the deposited film as a contaminant. As the tuning plate 202 and backing plate 206 are directly exposed to the cleaning agents entering the processing chamber 102 through the port 180 in the lid assembly 110, the elimination of anodization from surfaces of the tuning plate 202 and backing plate 206 facing the lid assembly 110 has been found to advantageously reduce the amount of fluorine present in films deposited on the substrate 140. Moreover, as the small diameter, high aspect ratio orifice holes 352 formed in the tuning plate 202 are not subjected to the multiple baths that are part of an anodization process, the orifice holes 352 remain free of bath residue that is difficult to remove from such small, high aspect ratio holes which may later contaminate the substrate during processing or cause one or more holes to be clogged with dried residue, resulting in non-uniform deposition.

The diffuser plate 204 is typically fabricated from stainless steel, aluminum, nickel or other RF conductive material. The diffuser plate 204 is generally about 0.855 in to at least about 1.8 in thick and provides the bulk of the stiffness of the gas distribution plate assembly 118.

The diffuser plate 204 includes the plurality of apertures 354 that align with the orifice holes 352 to form the gas passages 250. The aperture 354 formed in the diffuser plate 204 typically provides substantially no flow restriction as compared to the orifice hole 352. In the embodiment depicted in FIG. 3, the aperture 354, not being formed with an integral orifice hole through a single plate such as conventional gas distribution plates, contributes to a substantial fabrication cost reduction of the gas distribution plate assembly 118 over conventional designs.

In one embodiment, the diffuser plate 204 is fabricated from anodized aluminum. The anodized surface of the diffuser plate 204 facing the substrate support assembly 138 is exposed to the plasma during processing. It has been demonstrated that having the diffuser plate 204 fabricated from anodized aluminum contributes to process stability and deposition uniformity. Thus, in an embodiment where the diffuser plate 204 is anodized and the tuning plate 202 is not, the gas distribution plate assembly 118 may be fabricated in a cost effective manner by anodizing only those plates where anodization enhances processing while eliminating anodization where anodized surfaces or the process of anodization contributes to contamination during deposition.

Figure 5:
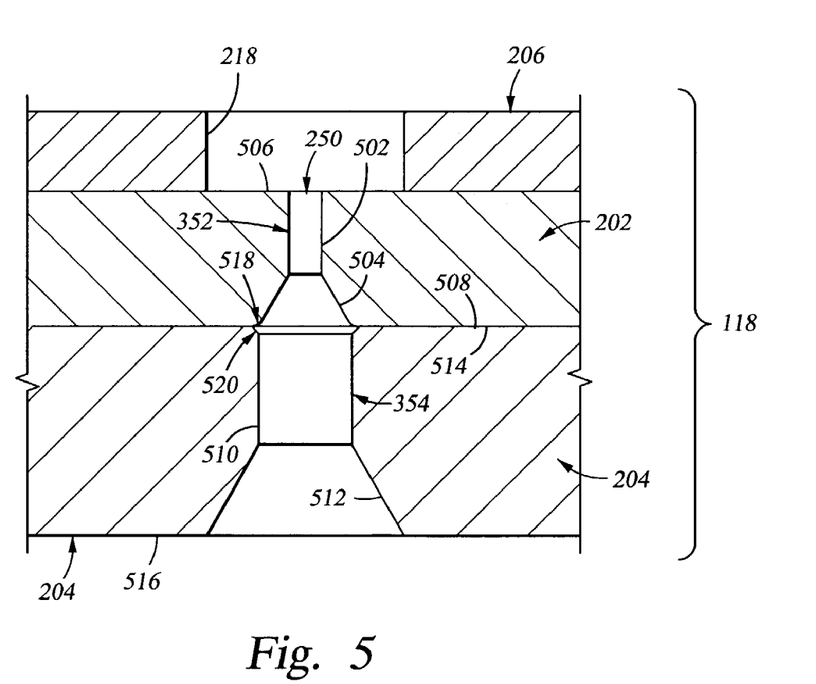
FIG. 5 is a partial sectional view of a gas passage formed through the gas distribution plate assembly of FIG. 3.

FIG. 5 is a sectional view of one embodiment of the plate assembly 118, illustrating the alignment of the orifice hole 352 and the aperture 354 that form one embodiment of a gas passage 250. The orifice hole 352 includes a bore 502 and a flared end 504. The bore 502 generally extends from a first side 506 of the tuning plate 202 to the flared end 504. The flared end 504 generally increases in sectional area until terminating at the surface of a second side 508 of the tuning plate 202. The flared end 504 compensates for small misalignments between the orifice hole 352 and the aperture 354.

Additionally, the relative lengths between the flared end 504 and bore 502 may be selected to alter the flow restricting attributes of the orifice hole 352. For example, the flared end 504 may extend further into the tuning plate 202, thereby decreasing the comparative length of the bore 502, reducing the flow resistance of the orifice hole 352. In another example, the angle of the flare defining the flared end 504 may be increased to reduce its contribution to the total resistance of the orifice hole 352. The flow restricting attributes of the orifice hole 352 may be influenced in other ways, including hole sectional profile (axially and/or laterally) and smoothness/roughness of the interior of the bore, relative length of the bore (to flared section within the same plate, or as dependent on the thickness of the plate) among other flow restricting attributes.

The aperture 354 includes a bore 510 and a flared end 512. The bore 510 generally extends from a first side 514 of the diffuser plate 204 to the flared end 512. The flared end 512 generally increases in sectional area until terminating at the surface of a second side 516 of the diffuser plate 204. The aperture 354 may alternatively have other configurations that enhance certain deposition processes. For example, extending bore 510 completely to the second side 516 of the diffuser plate 204 has been demonstrated to be advantageous for distributing gases during some deposition processes. One diffuser plate assembly having a similar gas passage configuration that may be adapted to benefit from the invention is described in U.S. patent application Ser. No. 10/140,324, filed May 6, 2002, which is hereby incorporated by reference in its entirety.

The orifice hole 352 and the aperture 354 have broken edges 518, 520 at the respective surfaces of the second side 508 of the tuning plate 202 and first side 514 of the diffuser plate 204. The broken edges 518, 520 may be a radius or chamfer, and are configured to minimize the inducement of turbulence as gas flows through the gas passage 250 between the tuning plate 202 and the diffuser plate 204. The holes 352 and apertures 354 may have alternative configurations, for example, straight bores or complex profiles.

Returning to FIG. 3, a plurality of locating features 346 are disposed between the tuning plate 202 and the diffuser plate 204 to maintain alignment between the orifice holes 352 and the apertures 354 that comprise the gas passages 250. In one embodiment, the locating features 346 are a plurality of locating pins 344 (one of which is shown) disposed between the tuning plate 202, the diffuser plate 204 and backing plate 206. In the embodiment depicted in FIG. 3, the locating pins 344 extend from the diffuser plate 204 to engage a mating bushing 342 that is press-fit through the backing plate 206. An exterior surface 340 of each of the bushings 342 locates the tuning plate 202 to the backing plate 206. The pins 344 may be positioned so that alignment of the orifice holes 352 and the apertures 354 that comprise the gas passages 250 and predefined orientation between the tuning plate 202 and diffuser plate 204 is assured. The tuning plate 202 and diffuser plate 204 may be fastened together in any number of manners, including fasteners, rivets, screws, brazing, welding, adhesives, clamps and the like.

Figure 6:
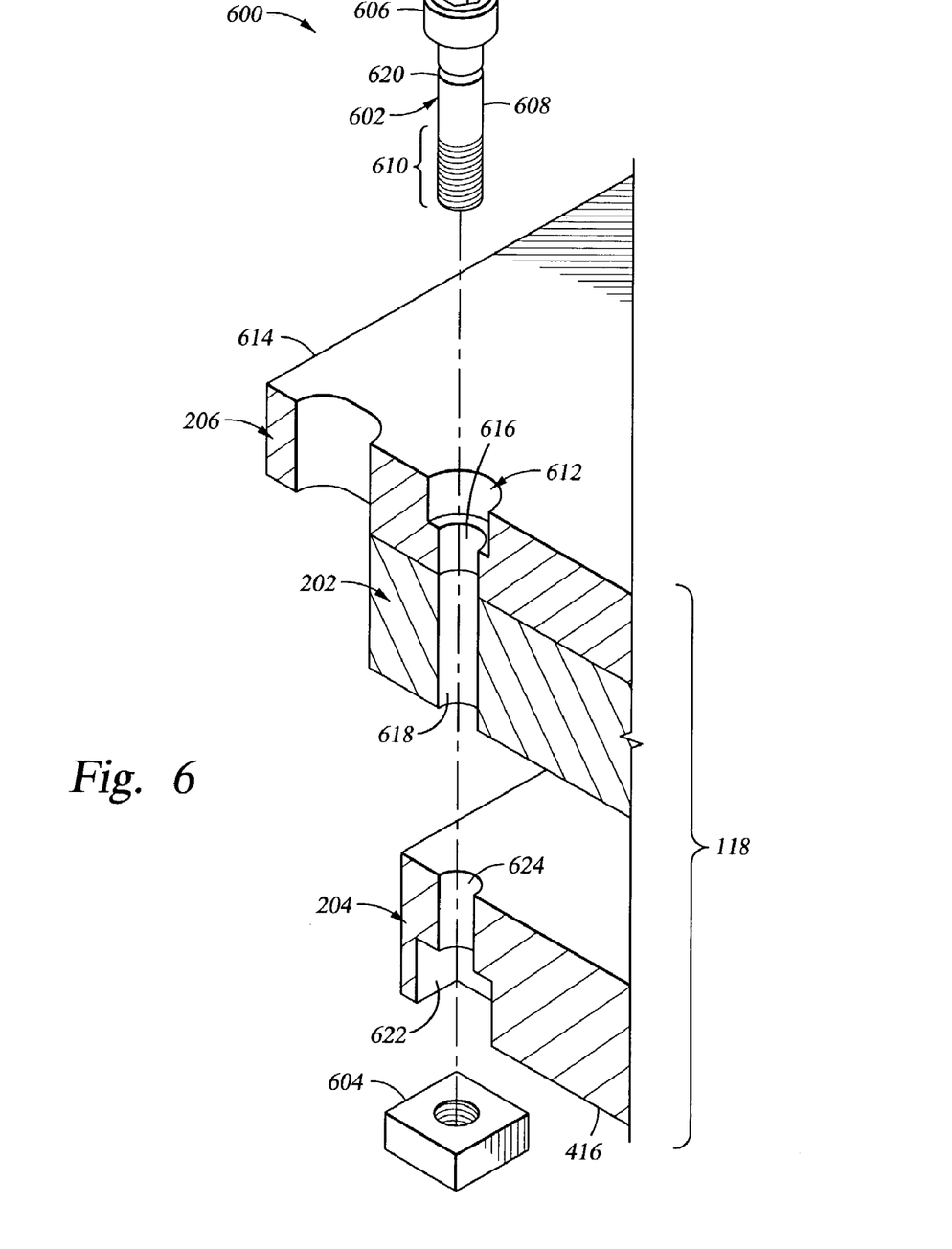
FIG. 6 is an exploded partial sectional view of the gas distribution plate assembly of FIG. 2A depicting a breakaway fastening system.

FIG. 6 is an exploded, partial sectional view of the tuning plate 202 and diffuser plate 204 depicting a representative breakaway fastener system 600 utilized in one embodiment to secure the backing plate 206 and tuning plate 202 to the diffuser plate 204 at regular intervals. Each of the breakaway fastener systems 600 typically includes a fastener 602 and a mating nut 604, both of which are typically fabricated from aluminum or other suitable material. In applications where it is advantageous to use aluminum fasteners to minimize fastener material effects on processing, the breakaway fastener system 600 allows the tuning plate 202 and diffuser plate 204 to be separated where traditional aluminum fasteners would seize, requiring removal and re-threading of components.

The fastener 602 has a head 606, a shank 608 and a threaded portion 610. The head 606 is typically disposed in a counter bore 612 formed in a top surface 614 of the backing plate 206 (or in the orifice plate 202 in embodiments not incorporating the backing plate 206). A hole 616 is formed through the backing plate 206 concentrically to the counter bore 612 to accept the shank 608 of the fastener 604. The shank 608 passes through a hole 618 formed through the tuning plate 202 that aligns concentrically with the hole 616. The shank 608 typically includes a necked portion 620 adapted to shear when the fastener 602 is subjected to a torque in excess of a predetermined amount.

The nut 604 is typically disposed in a slot 622 formed in the second side 416 of the diffuser plate 204. The slot 622 is in communication with a hole 624 formed through the diffuser plate 204 that is adapted to align concentrically with the holes 616, 618 when the plates 202, 204, 206 are positioned against one another. The shank 608 passes through the holes 616, 618, 624 to expose the threaded portion 610 in the slot 622. The nut 604 disposed in the slot 622 is mated with the threaded portion 610 of the fastener 602. The slot 622 is configured to prevent the nut 604 from tuning as the fastener 602 is tightened to urge the plates 202, 204, 206 against each other.

The breakaway fastener system 600 provides a number of advantages. First, a used diffuser plate 204 may be replaced with a new diffuser plate 204 when dirty, clogged, damaged or to provide a different configuration of apertures 354 (see FIG. 5) suitable for a particular deposition process. Replacing only the diffuser plate 204 provides a substantial cost savings over replacing the entire gas distribution plate assembly 118. Additionally, the tuning plate 202 may be replaced with a replacement tuning plate that has different flow characteristics through the orifice holes 352 comprising the first portion of the gas passages 250. For example, the sectional area of the orifice holes 352 may be different between cover plates, thereby altering the flow characteristics through the gas distribution plate assembly 118, advantageously providing another attribute through which processing control may be realized or to facilitate a different deposition process within the same processing chamber 102.

Figure 7A:
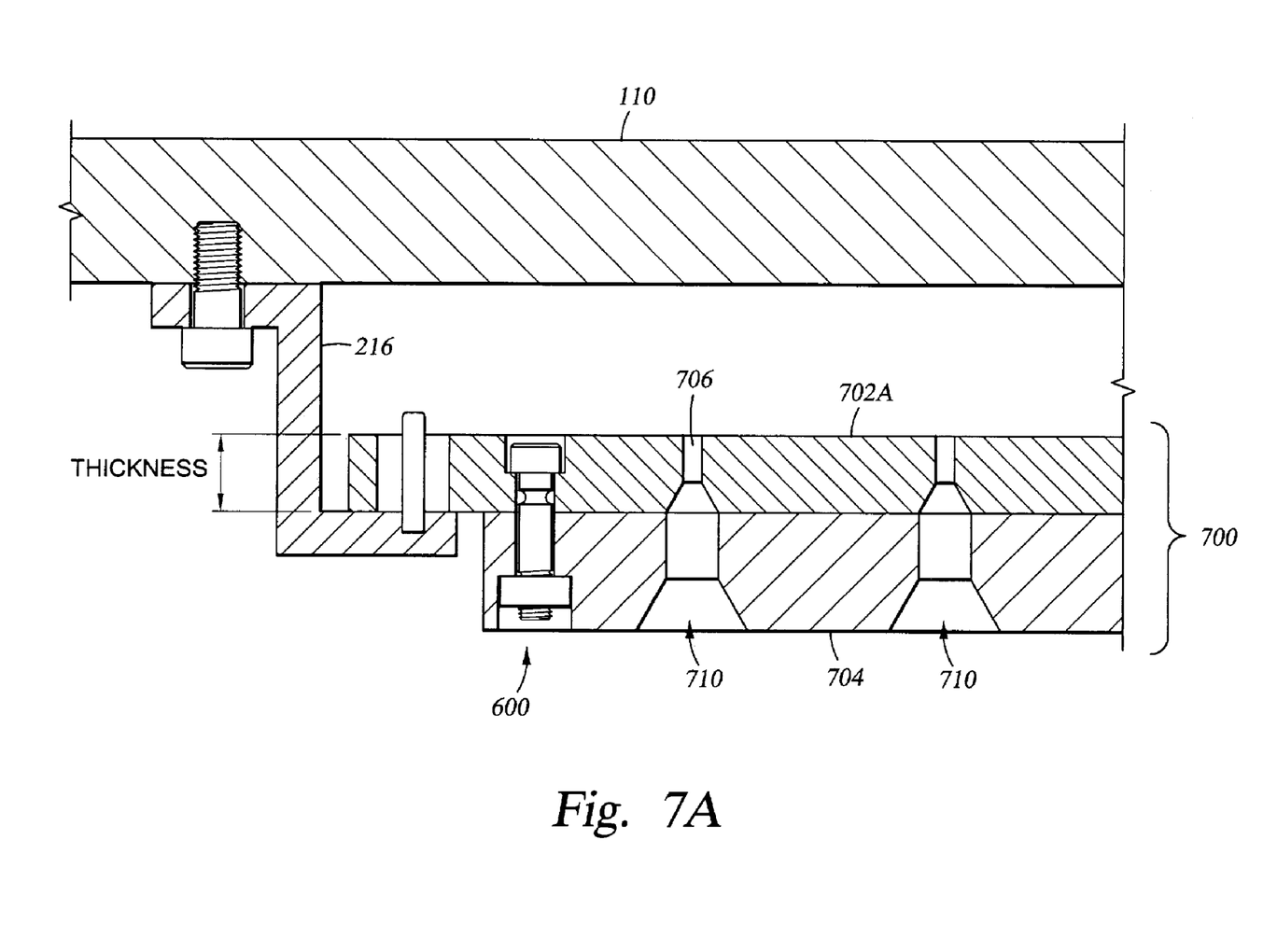
FIGS. 7A-B are plan views of a gas distribution plate assembly having one embodiment of a replacement tuning plate.
Figure 7B:
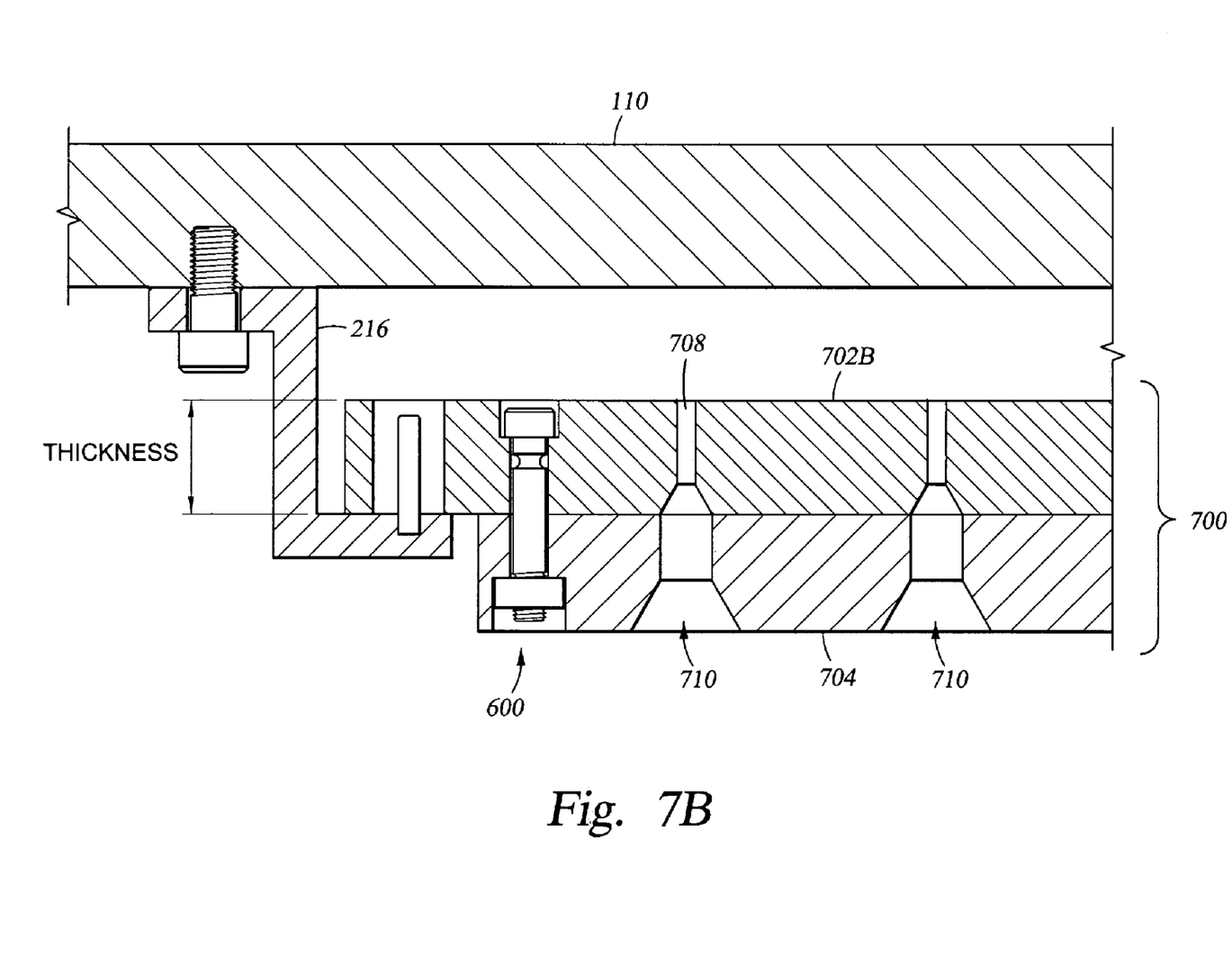

FIGS. 7A-B depict a sectional views of a gas distribution plate assembly 700 having a first tuning plate 702A shown in FIG. 7A and a replacement tuning plate 702B shown in FIG. 7B coupled to a diffuser plate 704. Although the first tuning plate 702A is shown coupled to a lid assembly 110 by an expansion bracket 216, the first tuning plate 702A of the distribution plate assembly 700 may be coupled directly to the lid 110.

In one embodiment, the tuning plate 702A has a first thickness and includes a plurality of orifice holes 706 having a first diameter formed therethrough that forms a portion of a gas passage 710. The combination of the plate's thickness and hole diameter gives each orifice hole 706 a predetermined flow resistance that may be selected to adjust the flow of fluids through the gas passages 710 of the gas distribution plate assembly 700 to enhance the performance of a predetermined deposition process.

The tuning plate 702B has a second thickness and includes a plurality of orifice holes 708 having a second diameter formed therethrough that forms a portion of the gas passage 710 of the plate assembly 700. The thickness of the tuning plate 702B is different (i.e., thicker or thinner) than the thickness of the tuning plate 702A. The second diameter of the orifice holes 708 is, in one embodiment, the same as the first diameter of the orifice holes 706. Thus, the difference in plate thickness between the plates 702A, 702B results in a change in the flow resistance of the gas passages 710, thereby allowing the flow characteristics of the gas distribution plate assembly 700 to be adjusted to optimize a subsequent deposition process without having to change out the entire gas distribution plate assembly 700.

Figure 8A:
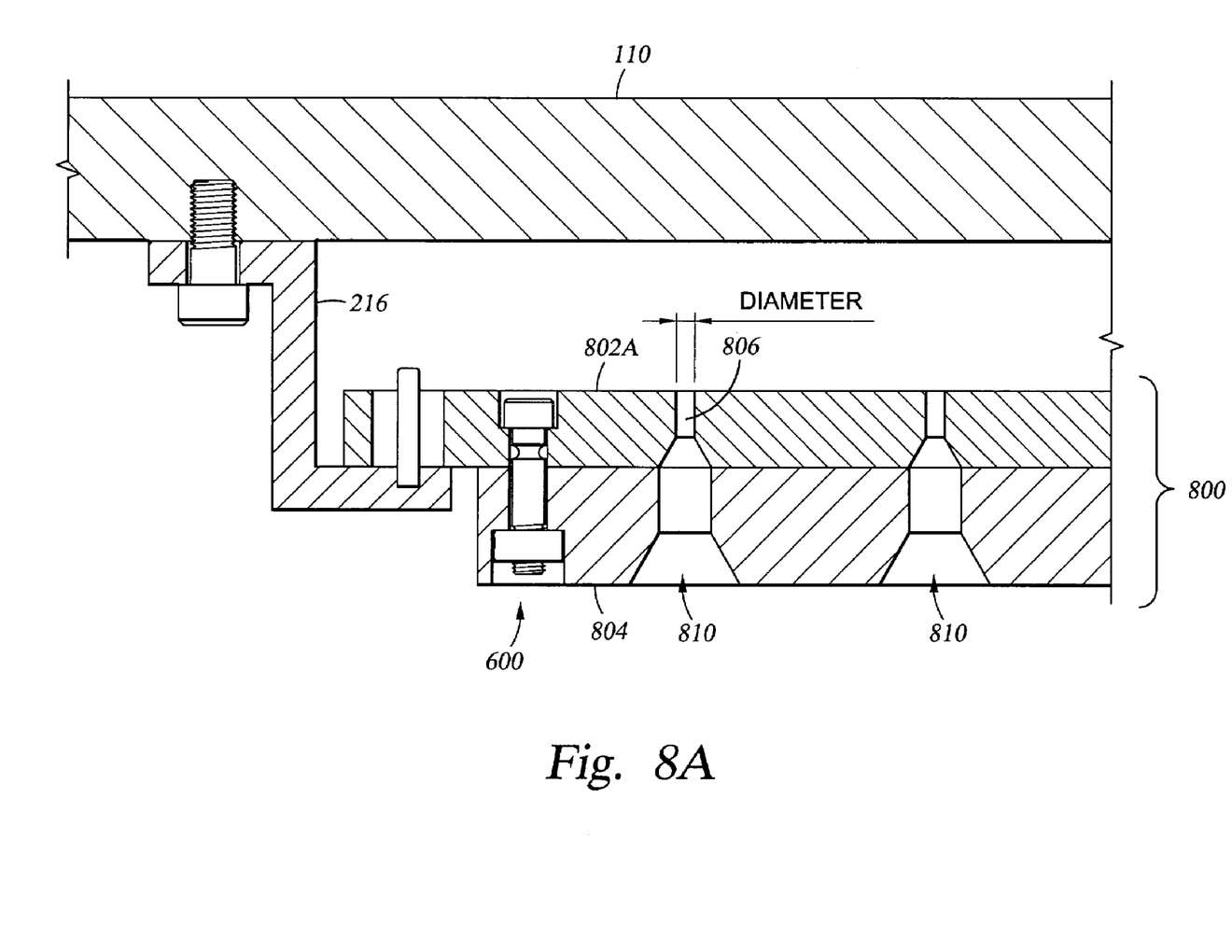
FIGS. 8A-B are plan views of a gas distribution plate assembly having another embodiment of a replacement tuning plate.
Figure 8B:
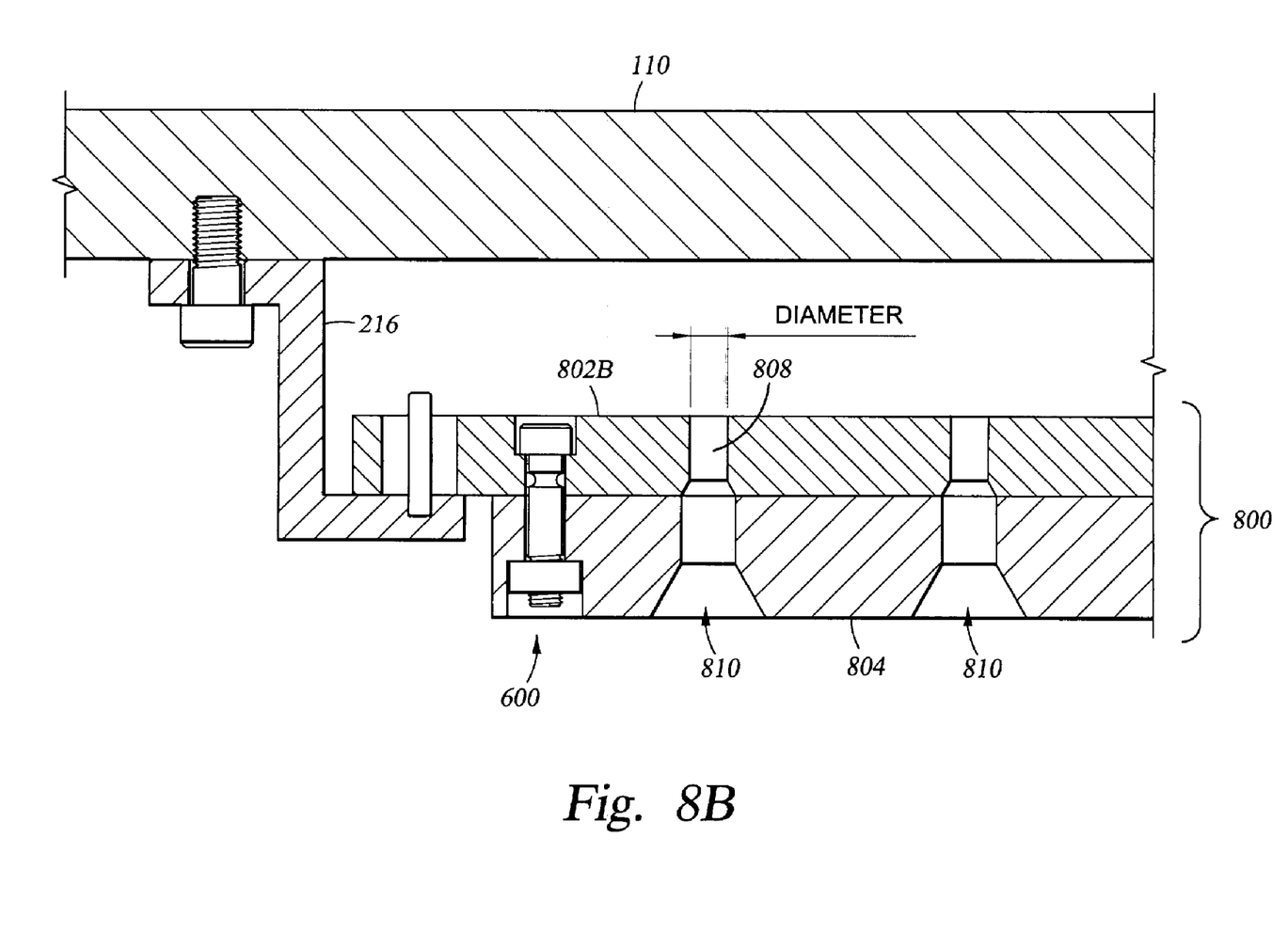

FIGS. 8A-B depicts another embodiment of a gas distribution plate assembly 800 having a tuning plate and a diffuser plate 804. The flow characteristics of the gas distribution plate assembly 800 may be adjusted by switching the tuning plate coupled to the diffuser plate 804 from a first tuning plate 802A to a second tuning plate 802B of the same thickness. The tuning plate 802A has orifice holes 806 of a first diameter. The tuning plate 802B has orifice holes 808 of a second diameter that is different than the first diameter.

Figure 9:
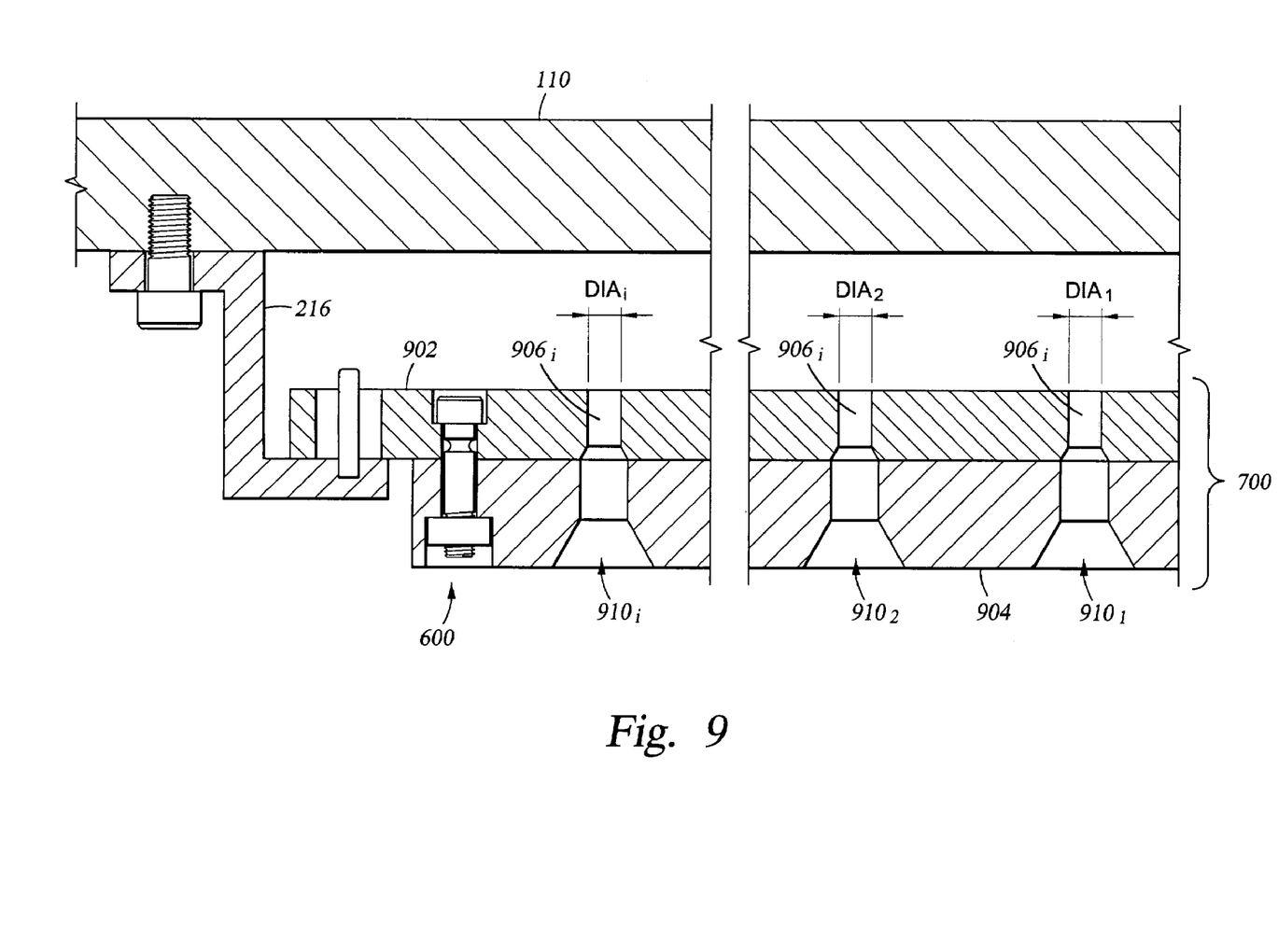
FIG. 9 depicts another embodiment of a gas distribution plate assembly.

FIG. 9 depicts another embodiment of a gas distribution plate assembly 900. The gas distribution plate assembly 900 includes a tuning plate 902 coupled to a diffuser plate 904 having gas passages $910_1 \ldots 910_i$, where i is a positive integer representing an outermost gas passage. The diffuser plate 904 is similar to the diffuser plate 204 described above. The tuning plate 902 has a plurality of orifice holes $906_1 \ldots 906_i$, each forming a portion of the gas passages $910_1 \ldots 910_i$. The diameters of at least two of the orifice holes $906_1$ to $906_i$ are different to provide a predetermined, non-uniform flow distribution of process gas through the gas distribution plate assembly 900. For example, a diameter of orifice hole $906_{i-1}$ may be larger than a diameter of orifice hole $906_i$, resulting in the reduction of gas flow at the edge of the substrate positioned below the gas distribution plate assembly 900. Alternatively, the diameter of the orifice hole $906_{i-1}$ may be smaller than a diameter of orifice hole $906_i$, resulting in the increase of gas flow at the edge of the substrate. Some of the orifice holes $906_1$ to $906_i$ may have equal diameters.

If is contemplated that the flow characteristics of the tuning plate 902 may be adjusted by replacing a first tuning plate with a second tuning having different flow attributes as discussed above. For example, the orifice holes of a second tuning plate may have a different distribution of sectional area among the orifice holes as compared to the first tuning plate. Alternatively, the thickness between the tuning plates may be changed, or other combination of changes that provide a desired flow resistance through the gas distribution plate assembly 800.

Thus, the difference in orifice hole diameters between the plates 802A, 802B results in a change in the flow resistance, allowing the flow characteristics of the gas distribution plate assembly 800 to be advantageously adjusted to suit a change in processing. Optionally, the thickness of the plates 802A, 802B may also be adjusted to provide a greater range of flow control. Thus, a gas distribution plate assembly has been provided that is economical to fabricate. Moreover, the gas distribution plate assembly is configured to minimize possible particulate generation and contamination during fabrication that may be released during processing. Furthermore, the gas distribution plate assembly provided advantageously allows gas flow characteristics to be adjusted by replacing one plate of the assembly. Additionally, a system and method for coupling the plates of the gas distribution assembly has been provided that overcomes the galling and seizing issues commonly plaguing fasteners used in conventional gas distribution plates.

Although several preferred embodiments which incorporate the teachings of the present invention have been shown and described in detail, those skilled in the art can readily devise many other varied embodiments that still incorporate these teachings.

What is claimed is:

1. A gas distribution plate assembly for a processing chamber, comprising: a tuning plate having a plurality of orifice holes formed therethrough; a diffuser plate disposed against a lower surface of the tuning plate, the diffuser plate having a plurality of apertures formed therethrough, each aperture aligned with a respective orifice hole in the tuning plate and defining a gas passage through the gas distribution plate assembly, wherein each aperture has a sectional area greater than the respective orifice hole in the tuning plate; and an expansion bracket extending above an upper surface of the tuning plate and configured to position the tuning plate in a vertically spaced-apart relation to a lid of the processing chamber, the expansion bracket further having an inwardly extending flange, wherein the flange of the expansion bracket is adapted to support the tuning and diffuser plates.

2. The gas distribution plate assembly of claim 1, wherein the tuning plate is thinner than the diffuser plate.

3. The gas distribution plate assembly of claim 1, wherein the tuning plate and the diffuser plate are comprised of aluminum.

4. The gas distribution plate assembly of claim 1, wherein a surface of the tuning plate facing away from the diffuser plate is non-anodized aluminum and a surface of the diffuser plate facing away from the tuning plate is anodized aluminum.

5. The gas distribution plate assembly of claim 1, wherein the tuning plate is coupled to the diffuser plate by at least one fastener.

6. The gas distribution plate assembly of claim 5 wherein the fastener further comprises: an aluminum shank that has a threaded portion; and an aluminum nut for engaging the threaded portion of the shank.

7. The gas distribution plate assembly of claim 6, wherein the aluminum shank further comprises a necked region adapted to shear when subjected to a stress exceeding a predetermined amount.

8. The gas distribution plate assembly of claim 1, wherein at least one of the orifice holes has a bore coupled to a flared portion that exits a side of the tuning plate disposed against the diffuser plate.

9. The gas distribution plate assembly of claim 1, wherein at least one of the apertures has a bore coupled to a flared portion that exits a side of the diffuser plate facing away from the tuning plate.

10. The gas distribution plate assembly of claim 1, wherein at least one orifice hole has a radius or chamfer edge disposed against the diffuser plate and at least one aperture has a radius or chamfer edge disposed against the tuning plate.

11. The gas distribution plate assembly of claim 1 further comprising: a backing plate coupled to the tuning plate opposite a surface of the tuning plate in contact with the diffuser plate.

12. The gas distribution plate assembly of claim 11, wherein the expansion bracket circumscribes the backing plate and coupled thereto in a manner that accommodates differences in thermal expansion.

13. The gas distribution plate assembly of claim 12, wherein the expansion bracket further comprises: a flange having a plurality of pins extending therefrom and adapted to mate with a slot formed in the backing plate.

14. The gas distribution plate assembly of claim 1, wherein the diffuser plate is polygonal.

15. The gas distribution plate assembly of claim 1, wherein the diffuser plate is a disk.

16. The gas distribution plate assembly of claim 1, wherein at least one of the orifice holes formed through the tuning plate has a flow restricting attribute different than another one of the orifice holes.

17. The gas distribution plate assembly of claim 1, wherein the plurality of orifice holes defines a first set of orifice holes and at least a second set of orifice holes disposed inward of the first set of orifice holes and having a flow restricting attribute different than the first set of orifice holes.

18. The gas distribution plate assembly of claim 16, wherein the flow restricting attribute comprises one or more orifice hole attributes selected from the group consisting of sectional area, hole section profile, bore smoothness, bore depth, length of concentric flared sections of the orifice hole, angle of concentric flared sections of the orifice hole, and amount of orifice hole chamfer.

19. A gas distribution plate assembly, comprising: a first plate having a first surface and a second surface, the first surface free of anodization; a second plate coupled to the first plate, the second plate having a first side disposed against the second side of the first plate and a second side that is anodized, wherein the second plate is thicker than the first plate; a plurality of gas passages each having a first portion formed through the first plate and a second portion formed through the second plate, wherein the first portion of the gas passage has a sectional area less than the second portion thereof and an expansion bracket extending above an upper surface of the first plate and configured to position the first plate in a vertically spaced-apart relation to a lid of a processing chamber, the expansion bracket further having an inwardly extending flange, wherein the flange of the expansion bracket is adapted to support the tuning and diffuser plates.

20. The gas distribution plate assembly of claim 19 further comprising: an aluminum fastener disposed through the first plate and the second plate, the fastener having a necked region adapted to shear when subjected to a stress exceeding a predetermined amount; and an aluminum nut mated to the fastener.

21. The gas distribution plate assembly of claim 20, wherein the second plate further comprises a slot adapted to receive the nut.

22. The gas distribution plate assembly of claim 19, wherein the plurality of gas passages includes at least a first bore formed through the first plate and having a flared portion that exits a side of the first plate disposed against the second plate.

23. The gas distribution plate assembly of claim 19, wherein the plurality of gas passages further comprises: at least a first bore formed through the first plate and having a flared portion that exits a side of the first plate disposed against the second plate; and at least a second bore formed through the second plate and disposed inward of the first bore, the second bore having a flow restricting attribute different than the first bore.

24. A gas distribution plate assembly for a processing chamber, comprising: a first plate having a plurality of holes formed therethrough, at least one anodized surface, and at least one non-anodized surface; and, a second plate coupled to the first plate, the second plate having holes formed therethrough and aligned with each of the holes of the first plate to define gas passages through the plates, the second plate also having at least one anodized surface, and at least one non-anodized surface, an expansion bracket extending above an upper surface of the first plate wherein: the anodized surface of the first plate is disposed against the non-anodized surface of the second plate; and each hole of the second plate has a sectional area greater than the respectively aligned hole of the first plate, wherein the second plate is thicker than the first plate, the expansion bracket further having an inwardly extending flange, wherein the flange of the expansion bracket is adapted to support the first and second plates.

25. The gas distribution plate assembly of claim 19 further comprising: an aluminum fastener disposed through the first plate and the second plate, the fastener having a necked region adapted to shear when subjected to a stress exceeding a predetermined amount; and an aluminum nut mated to the fastener.

26. The gas distribution plate assembly of claim 25, wherein the second plate further comprises a slot adapted to receive the nut.

27. The gas distribution plate assembly of claim 24, wherein the plurality of gas passages includes at least a first bore formed through the first plate and having a flared portion that exits a side of the first plate disposed against the second plate.

28. The gas distribution plate assembly of claim 24, wherein the plurality of gas passages further comprises: at least a first bore formed through the first plate and having a flared portion that exits a side of the first plate disposed against the second plate: and at least a second bore formed through the second plate and disposed inward of the first bore, the second bore having a flow restricting attribute different than the first bore.

29. A gas distribution plate assembly for a processing chamber, comprising: a tuning plate having a plurality of orifice holes formed therethrough; and a diffuser plate disposed against the tuning plate having a plurality of apertures formed therethrough, an expansion bracket extending above an upper surface of the tuning plate, wherein each aperture is aligned with a respective orifice hole in the tuning plate and defining a gas passage through the gas distribution plate assembly, wherein each aperture has a sectional area greater than the respective orifice hole in the tuning plate, and wherein the tuning plate is thinner than the diffuser plate, the expansion bracket further having an inwardly extending flange, wherein the flange of the expansion bracket is adapted to support the tuning and diffuser plates.

30. A gas distribution plate assembly for a processing chamber, comprising: a plate assembly configured for mounting in a space-apart relation to a lid of the processing chamber, a top surface of the plate assembly adapted to bound a portion of a plenum defined between the plate assembly and the lid, the plate assembly further comprising: a tuning plate forming the top surface of the plate assembly; a diffuser plate disposed against the tuning plate, the diffuser plate thicker than the tuning plate; an expansion bracket extending above an upper surface of the tuning plate and a plurality of gas passages, each gas passage extending axially from a top of the tuning plate to a bottom of the diffuser plate and isolated from the other gas passages, wherein a portion of the gas passages formed in the tuning plate have a smaller diameter than a portion of the gas passages formed in the diffuser plate, the expansion bracket further having an inwardly extending flange, wherein the flange of the expansion bracket is adapted to support the tuning and diffuser plates.

* * * * *